United States Patent [19]
Hojabri

[11] Patent Number: 6,147,523
[45] Date of Patent: Nov. 14, 2000

[54] OVERSHOOT CONTROL AND DAMPING CIRCUIT FOR HIGH SPEED DRIVERS

[75] Inventor: Peyman Hojabri, San Jose, Calif.

[73] Assignee: National Semiconductor Corporation, Santa Clara, Calif.

[21] Appl. No.: 09/102,159

[22] Filed: Jun. 22, 1998

[51] Int. Cl.[7] .............................. H03K 5/08; H03B 1/00
[52] U.S. Cl. ..................... 327/110; 327/379; 327/309; 327/310; 360/46
[58] Field of Search ................... 327/379, 380, 327/384, 110, 309, 310; 326/34, 27, 87; 360/46, 67

[56] References Cited

U.S. PATENT DOCUMENTS

| | | | |
|---|---|---|---|
| 5,282,094 | 1/1994 | Ngo | ........................................ 360/46 |
| 5,465,406 | 11/1995 | Whitecar et al. . | |
| 5,469,095 | 11/1995 | Peppiette et al. | ........................ 327/110 |
| 5,523,631 | 6/1996 | Fishman et al. . | |
| 5,880,626 | 3/1999 | Dean | ........................................ 327/110 |

OTHER PUBLICATIONS

A Low–Power 3V–5.5V Read/Write Preamplifier for Rigid–Disk Drives, Tuan Ngo, Craig Brannon, John Schier, 1994 IEEE International Solid–State Circuits Conference, pp. 286–287.

*Primary Examiner*—Dinh T. Le
*Attorney, Agent, or Firm*—Baker & McKenzie

[57] ABSTRACT

An overshoot and damping control circuit for high speed L-R-C drivers. By properly configuring four transistors in conjunction with a high speed driver, negative feedback can be utilized to generate a spike of current to correct for overshoot which results when driving an inductive load with high speed signals. This same configuration also provides the additional benefit of providing a signal which dampens the ringing which results from driving an inductive load with a high speed signal.

17 Claims, 6 Drawing Sheets

CURRENT THROUGH LOAD
WITHOUT OVERSHOOT CIRCUIT

CURRENT THROUGH LOAD
WITH OVERSHOOT CIRCUIT

FIGURE 5A (CURRENT TO OFFSET OVERSHOOT)

(CURRENT THROUGH LOAD)

(Voltage at Node A)

OVERSHOOT CONTROL AND DAMPING CIRCUIT FOR HIGH SPEED DRIVERS

BACKGROUND OF THE INVENTION

1. Field of the Invention

The present invention relates to a circuit for providing overshoot control and damping in a system for providing a high speed driving signal. It is desirable to provide a system which can generate a signal having a fast rise time and only minimal amount of overshoot and ringing.

2. Description of the Related Art

In a system where a fast rise time signal is needed to drive a load having inductive characteristics undesirable signal characteristics can result. For example, where an H bridge type circuit is used to power a load having inductive characteristics, when the current through the load is reversed a large current spike can result in response to the sudden change in current direction. In some applications, such as when supplying a current to drive a magneto-resistive head ("MR head") which is used in a disk drive to orientate the polarity of the disk storage media which is adjacent to the head, a large current spike can cause undesirable effects in the magnetic field which is generated by the MR head. Furthermore, due to potential variation of the MR head elements, the effect of the overshoot can very from one MR head element to another.

A second factor which should also be considered when driving an inductive load with a fast rise time current is that in addition to the current overshoot, a current ringing, or fluctuation, will often follow the overshoot, due to the resonance of the inductive load and its associated stray capacitance. Such current ringing is undesirable in many applications.

SUMMARY OF THE INVENTION

The present invention provides a circuit designed to supply a current to a load. This circuit is responsive to the tendency of an inductive load to cause a current overshoot and current ringing when the direction of the signal current is changed. Specifically, the circuit of the present invention senses a negative voltage spike when the current is reversed through the load, and in response to this voltage sends a burst of current through the load which tends to decrease the amount of current overshoot which would otherwise occur. Further the circuit of the invention senses ringing in the current through the load and provides a current to the load which tends to decrease the ringing and cause the signal current to reach the final value more quickly.

BRIEF DESCRIPTION OF THE DRAWINGS

The features and advantages of the circuit for reducing overshoot and ringing according to the present invention will be more clearly understood from the following description in conjunction with the accompanying drawings in which:

FIGS. 5A–5C show software simulation graphs of voltage and current at different points in the circuit of FIG. 4.

DETAILED DESCRIPTION OF THE INVENTION

Figure 1:
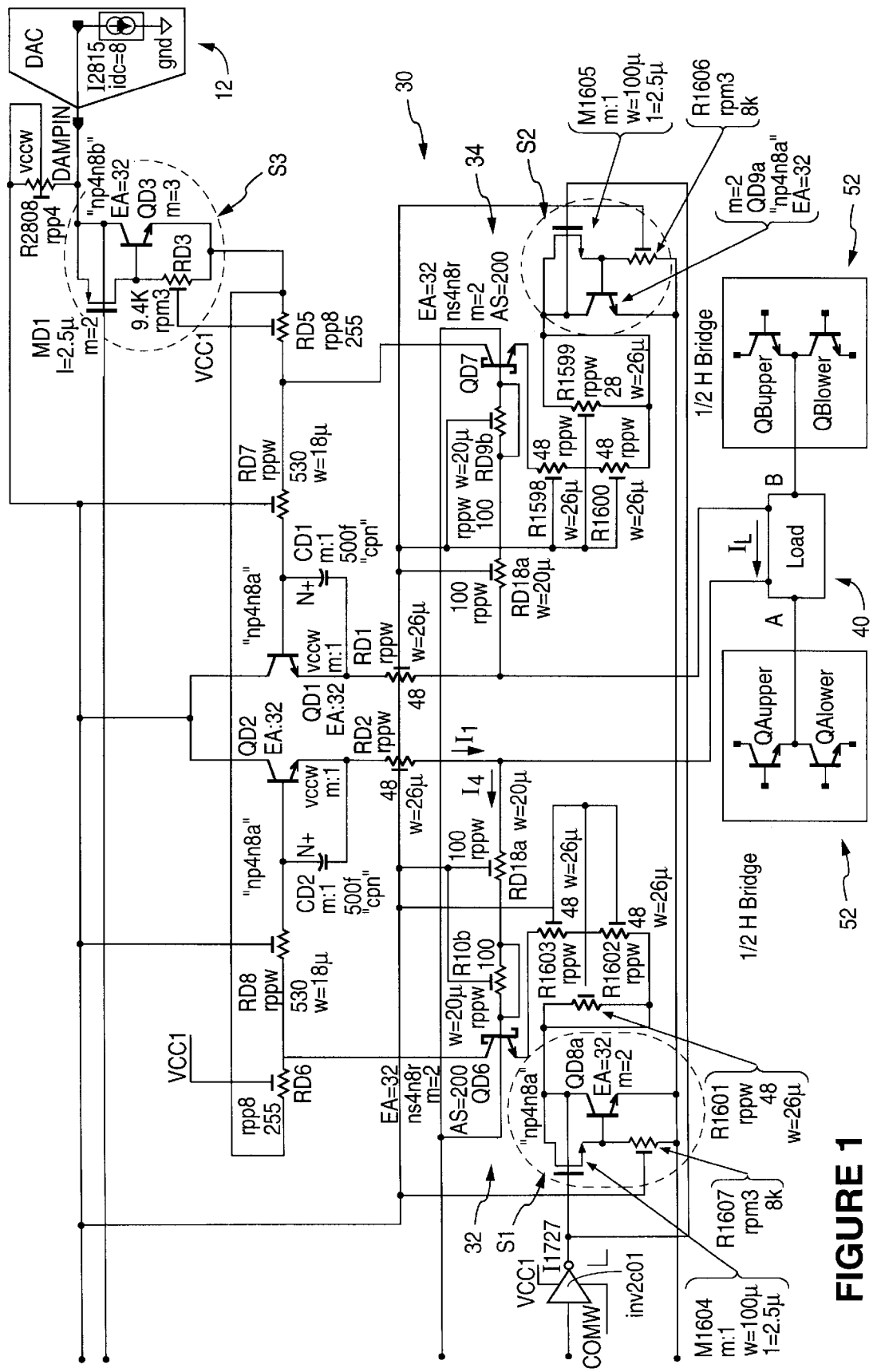
FIG. 1 is a schematic diagram of an embodiment of the invention.
Figure 4:
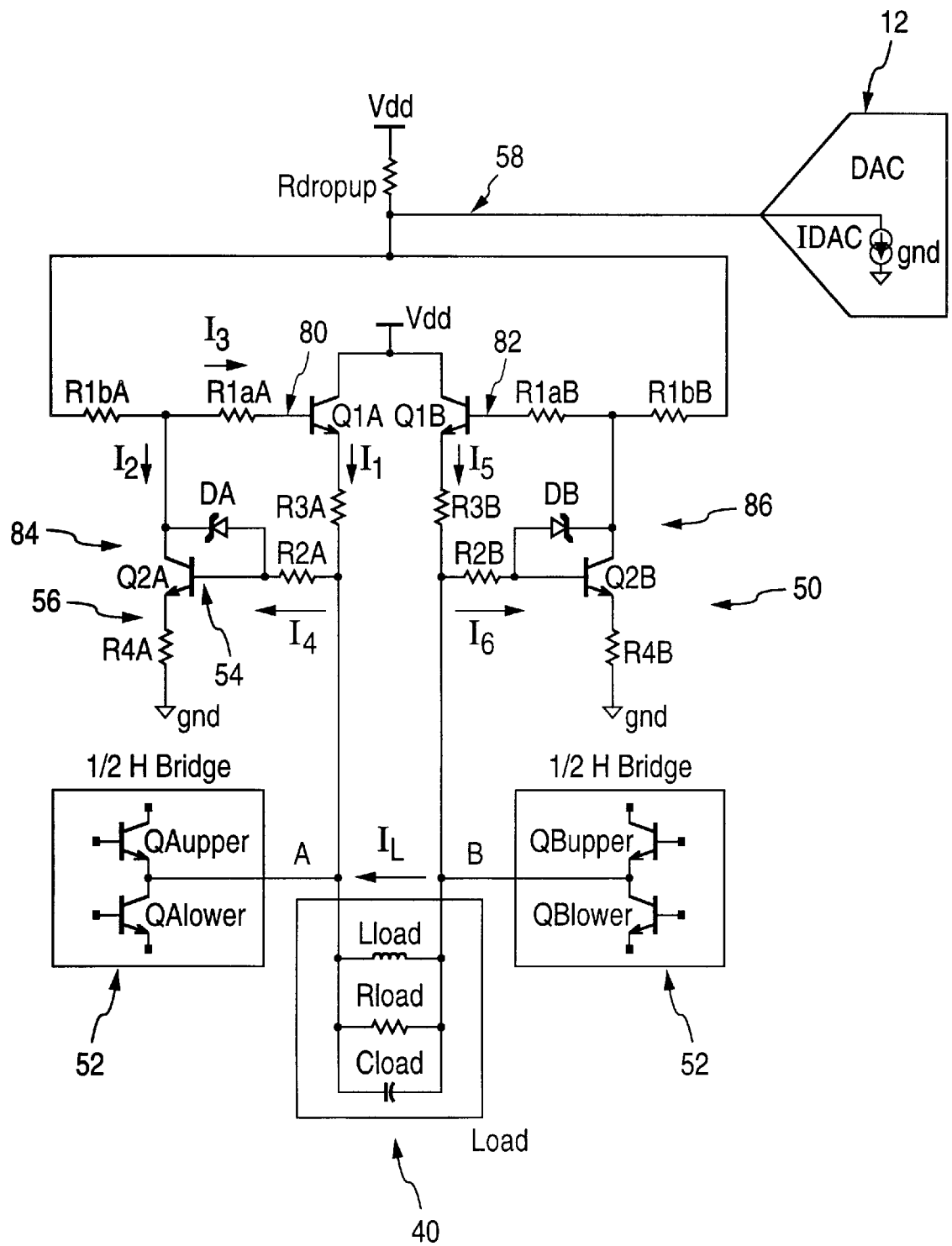
FIG. 4 is a schematic diagram of an embodiment of the invention.

FIG. 1 shows one embodiment of the invention. The load 40 shown in FIG. 1 has inductive characteristics. For example, the load may be a MR head such as used in a disk drive to orientate the magnetic dipoles of storage media on the disk which are proximate to the MR head. (A more detailed model of such a load 40 is shown in FIG. 4.) Current going through the MR head in one direction will provide orientation of a magnetic dipole of the storage media adjacent to the MR head in one direction, while current going through the MR head in the opposite direction will cause the orientation of the magnetic dipole to be in the opposite direction.

Figure 2:
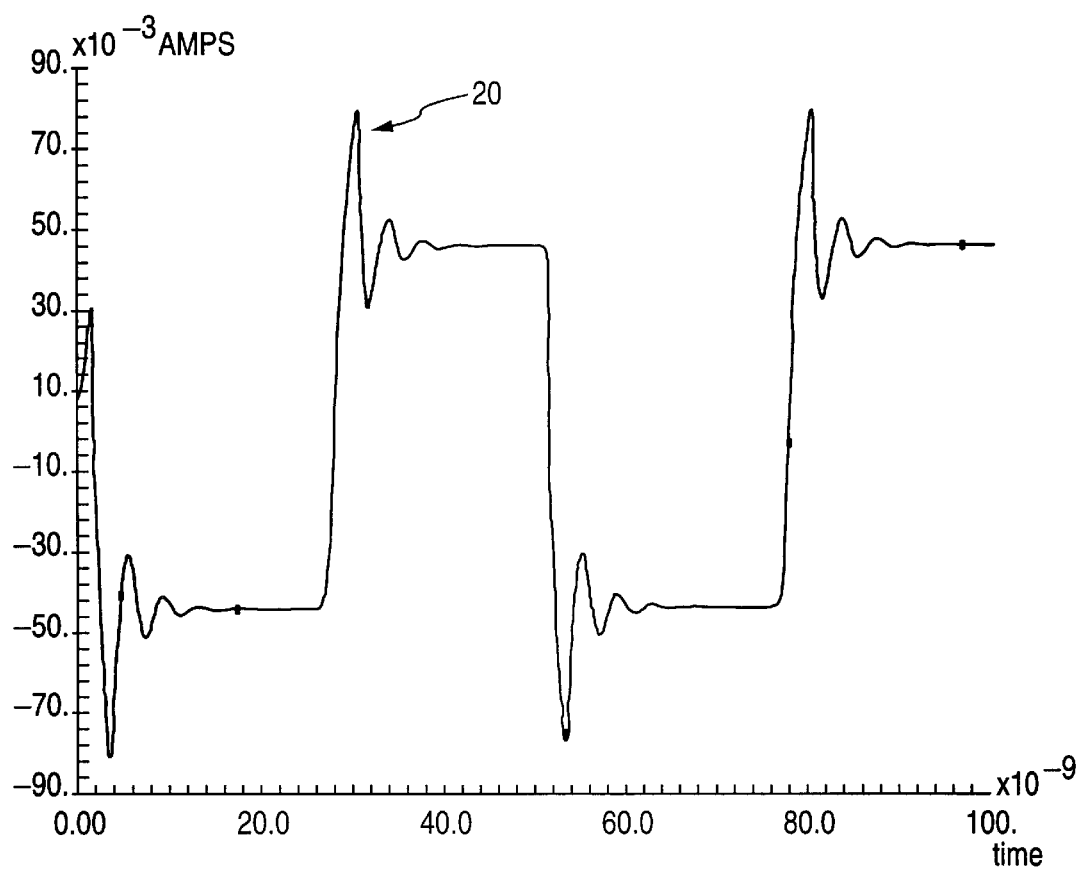
FIG. 2 is graph showing a software simulation of the current flowing through an inductive load without using the overshoot circuit.

When current going through an inductive load is reversed the inductance will cause a spike of current through the load. This current spike is referred to herein in as overshoot. FIG. 2 shows a software simulation graph of the current through such a load. At the point at which the current direction is reversed through the load the current spikes, as shown at point 20 in FIG. 2. Excessively large spikes, or overshoot, in current through the load are often undesirable. Thus, it is beneficial to provide a way to limit and control the magnitude of the current overshoot.

Figure 3:
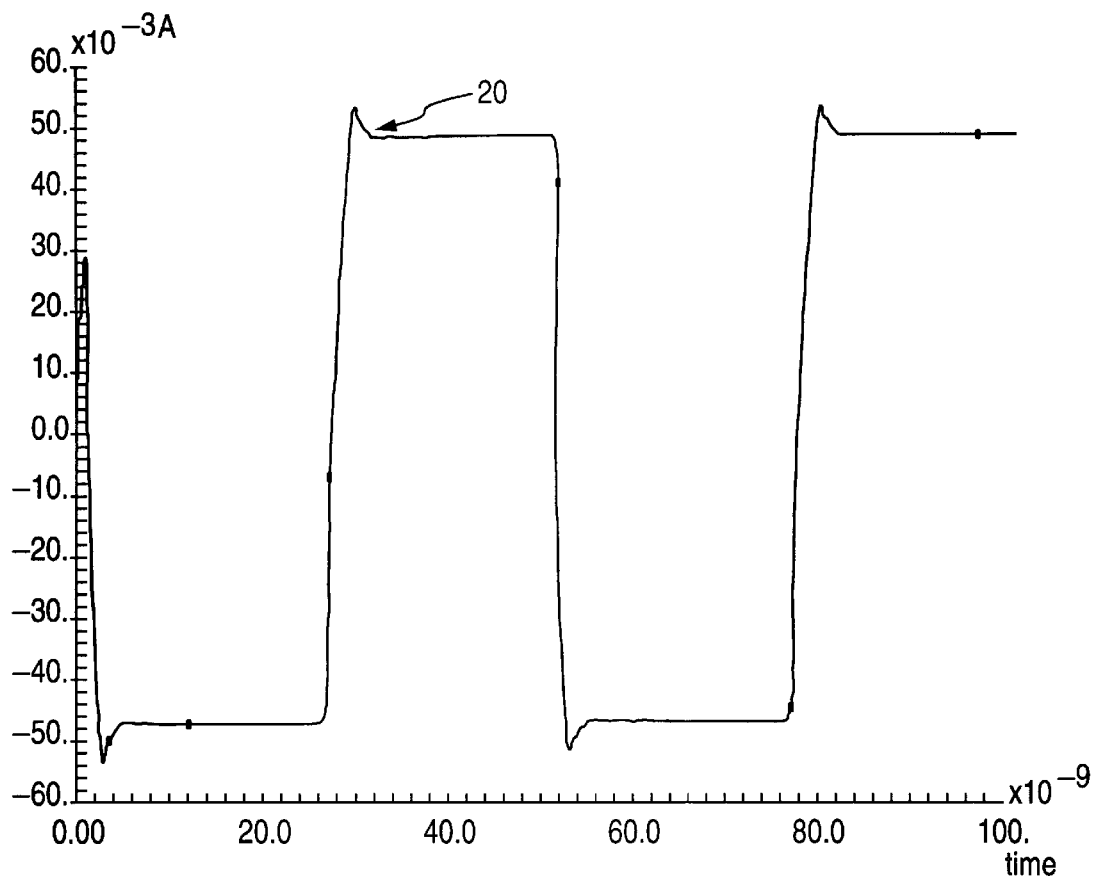
FIG. 3 is graph showing a software simulation of the current flowing through an inductive load when using the overshoot circuit.

The overshoot circuit of the invention provides a burst of current through the load in the opposite direction of the current overshoot. This burst of current counteracts the overshoot current which results when the current through the load is switched. FIG. 3 shows a software simulation of the current through a load where an H bridge circuit 52 is used in conjunction with the circuit of the invention to provide a driving current through a load. Note that the amount of overshoot 20 is reduced from about 32 ma, as shown in FIG. 2 for the system which does not have the overshoot circuit, to about 5 ma for the circuit which has an overshoot circuit.

A comparison of FIGS. 2 and 3 also shows that the amount of fluctuation, or ringing, in the current through the load immediately after switching the current direction is reduced when the overshoot circuit of the invention is used in conjunction with the H bridge circuit to drive the current through the load.

The operation of the overshoot circuit 50 shown in FIG. 4 will now be discussed. Nodes A and B are connected to the output of a standard H Bridge circuit 52.

When a constant current is flowing through the load 40 there is no current I1 flowing from the emitter of NPN transistor Q1A. When the direction of current flow through the load is reversed so that the current flow is reversed from flowing from A to B, so that it flows from B to A, a large negative transient voltage will result at node A. This negative voltage at node A causes the voltage at the base 54 of NPN transistor Q2A to be less than the voltage at the emitter 56 of transistor Q2A. This results in transistor Q2A turning off. When transistor Q2A turns off the current I2 flowing through the collector of transistor Q2A goes to zero. As the current I2 goes to zero the base current I3 of transistor Q1A suddenly increases. This sudden increase in the base current causes a sudden increase in current I1 from the emitter of transistor Q1A. The large increase in current I1 flows through the load 40 from A to B and reduces the overshoot. As the current IL through the load reaches a steady state, the negative voltage decreases at node A and the base voltage of transistor Q2A increases and transistor Q2A turns on. When transistor Q2A turns on its collector current I2 will suddenly increase and draw current away from the base of transistor Q1A. Thus, current I3 goes to zero and transistor Q1A turns off and current I1 goes to zero. The Schottky diodes, DA and DB, operate to prevent Q1A and Q2B from going into saturation.

In addition to reducing the overshoot current through the load, the overshoot circuit also functions to dampen the fluctuation, or ringing, of current IL going through the load 40 after the initial switching of the direction of current through the load. The circuit functions to dampen the ringing by responding to fluctuation in voltage at node A.

As the voltage at node A fluctuates with the ringing of current through the load, the base voltage of transistor Q2A also fluctuates which causes the value of current I4 to fluctuate and thereby either increase or decrease the amount of collector current I2 which flows through transistor Q2A. It should be noted that current I4 fluctuates such that it is 180 degrees out of phase with the ringing of the current IL through the load 40. When the current IL is flowing through the load 40 from node B to node A the current I4 is drawn from the upper transistor, QBupper, of the half of the H bridge circuit which is adjacent to node B.

It should be noted that in connection with the above discussion regarding the overshoot circuit 50 of FIG. 4, transistors Q1B and Q2B operate in the same manner as described with respect to transistors Q1A and Q2A, but they provide overshoot correction and dampening to node B, and respond to the conditions of node B.

The current DAC 12 is configured so that it can draw current from node 58. The DAC operates as a biasing signal source, but other devices could be used to serve this purpose. By drawing varying amounts of current away from node 58 the DAC 12 can vary the amount of voltage which is present at the bases 80, 82 of transistors Q1A and Q1B. The ability to vary the base voltages of NPN transistors Q1A and Q1B allows the amount of overshoot correction to be controlled. Specifically, as the digital signal input to the DAC 12 is changed to increase the base voltages of transistors Q1A and Q1B, the amount of current I1 and I5 available for overshoot correction is increased. Thus, the amount of overshoot correction can be increased by using the DAC 12 to increase the base voltage of Q1A and Q1B. Similarly, the amount of overshoot correction can be reduced by using the DAC 12 to decrease the base voltages of transistors Q1A and Q1B.

Figure 6:
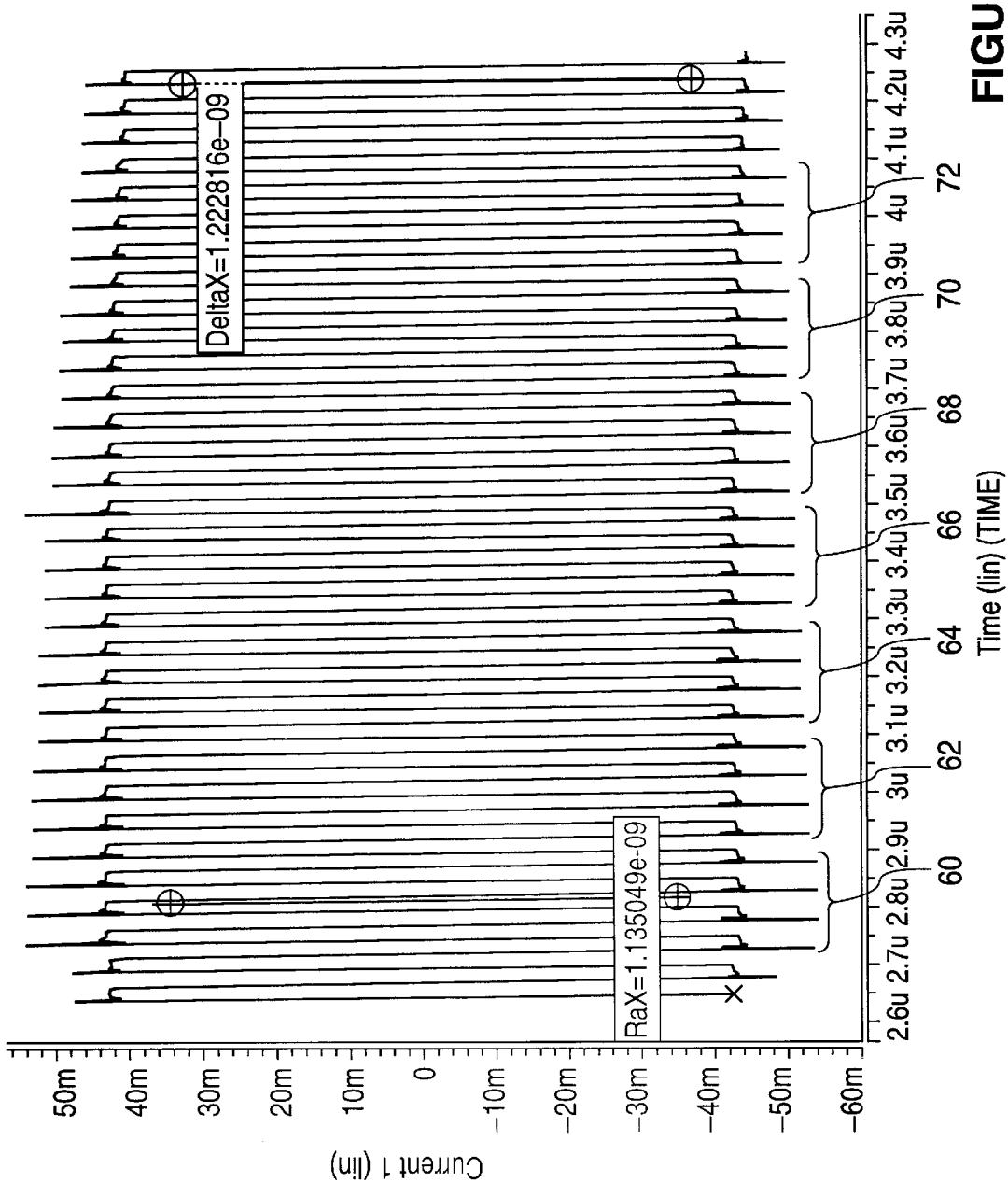
FIG. 6 is a graph of a software simulation of the current through the load in the circuit of FIG. 4.

FIG. 6 illustrates the effect of varying the input to the DAC, which thereby varies the amount of current overshoot. FIG. 6 shows a sequence of current signals switched through the load 40 connected between nodes A and B. Four switching sequence current peaks 60 are shown as having more overshoot than the adjacent subsequent current peaks 62. Similarly those current peaks 62 are shown as having more overshoot than the adjacent subsequent peaks 64 and so forth. Each of the sets of four peaks corresponds to a specific DAC 12 setting. As the DAC 12 output is increased, the current burst output by transistors Q1A and Q1B is increased so as to further reduce the amount of overshoot.

Figure 5B:
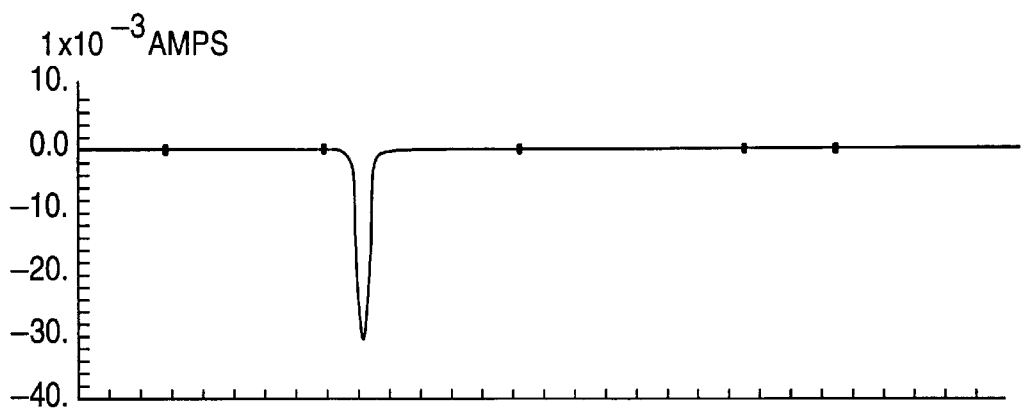
Figure 5B:
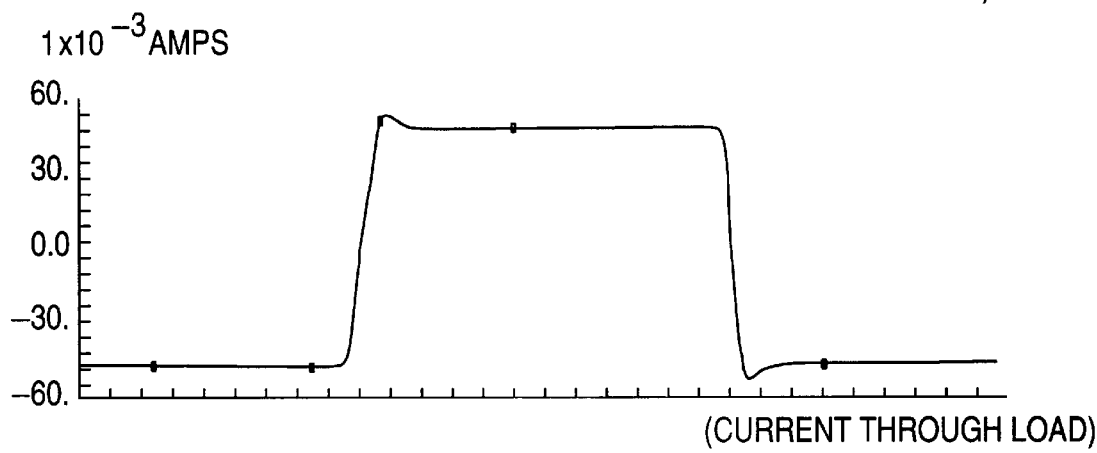
Figure 5C:
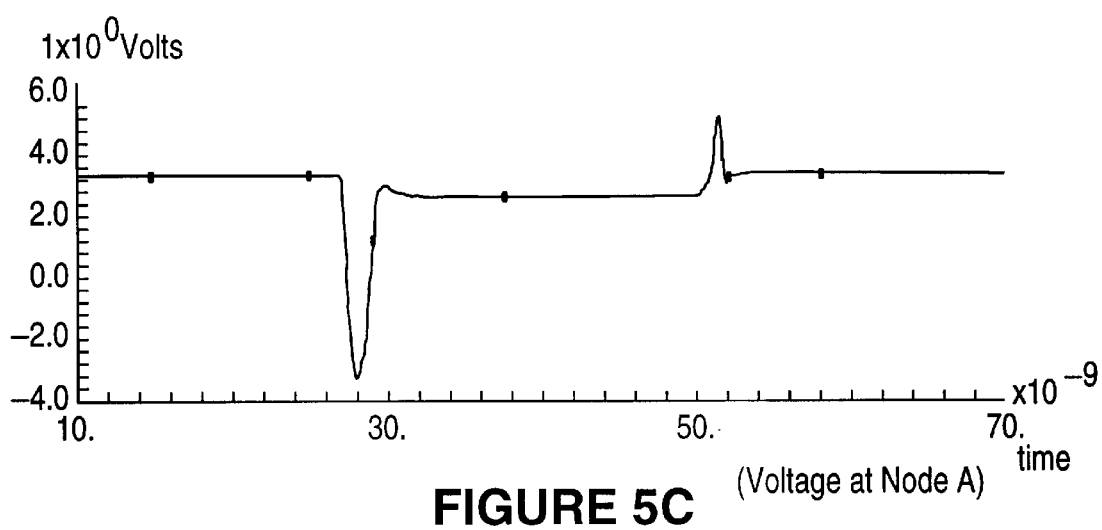

FIGS. 5A–5C, show additional information regarding the operation of the overshoot circuit 50. FIG. 5B shows the current IL going through the load 40 which is connected between nodes A and B. FIG. 5A shows the current I1 flowing from the emitter of NPN transistor Q1A through node A to offset current overshoot. FIG. 5C shows the voltage at node A. FIGS. 5A–5C show that the current pulse from NPN transistor Q1A (FIG. 5A) is generated in response to the sudden decrease in voltage at node A (FIG. 5C) which results from the reversal of the direction of current IL through the load 40. This current pulse from transistor Q1A operates to reduce the amount of current overshoot through the load 40.

Referring back to FIG. 1, the circuit shown therein is a schematic showing another embodiment of the overshoot circuit 30. The overshoot circuit of FIG. 1 is provided with a current DAC 12 which operates in the same manner as described in connection with the DAC 12 of FIG. 4.

The overshoot circuit 30 of FIG. 1 is provided with three switches S1, S2, S3. When the switches S1, S2, S3 are closed the overshoot circuit is disabled. This means that transistors QD1 and QD2 will not output bursts of currents in response to negative voltages at nodes A and B. It is desirable to be able to disable the overshoot circuit in situations where the load is being changed, and in other circumstances.

Transistors QD1 and QD2 have capacitors connected between their respective emitters and bases. These capacitors CD1, CD2 serve to speed up the current pulses which are output from the emitters of transistors QD1 and QD2 to offset the overshoot current.

The emitters of transistors QD1 and QD2 are connected via resistors RD1 and RD2 to nodes B and A, respectively. Also connected to nodes A and B are circuits 32 and 34 which correspond to the portions of the circuit designated as 84 and 86, respectively, in FIG. 4. For example, the pair of variable resistors identified as RD10a and R10b in FIG. 1 correspond to the resistor R2A of FIG. 4. The value of these resistors can be varied to change the value of current I4. (For example, as the resistance is increased the value of current I4 will decrease.) Transistors QD6 and QD7 are Schottky transistors which operate in a similar manner to the NPN transistor and Schottky diode configurations shown in FIG. 4. It should be noted that although the embodiments of the invention shown use NPN transistors, Schottky diodes and Schottky transistors, other solid state devises could be used. The resistors R1603, R1602 and R1601 correspond to resistor R4A.

Various other modifications and alterations in the structure and use of this invention will be apparent to those skilled in the art without departing from the scope and spirit of the invention. Although the invention has been described in connection with a specific preferred embodiment, it should be understood that the invention as claimed should not be unduly limited to any specific embodiment. It is intended that the following claims define the scope of the present invention and that structures and methods within the scope of these claims and their equivalents be covered thereby.

What is claimed is:

1. An apparatus for reducing current overshoot, comprising:

a first circuit coupled to a first node, wherein the first node is configured to couple to a first end of a load;

wherein the first circuit includes a first voltage controlled current source circuit which senses a voltage at the first end of the load and in response to a transient voltage at the first node provides a first current to be injected into the first node.

2. The apparatus of claim 1, wherein the first voltage controlled current source circuit comprises:

a first controllable current source responsively coupled with a first voltage controlled switch such that when the first voltage controlled switch is in a first state the first controllable current source is turned on and outputs the first current and when the first voltage controlled switch is in a second state the first controllable current source is turned substantially off.

3. The apparatus of claim 2, wherein:

the first controllable current source includes a first transistor; and the emitter of the first transistor is coupled to the first node.

4. The apparatus of claim 3, wherein:

the first voltage controlled switch includes a second transistor; and the base of the second transistor is coupled to the emitter of the first transistor.

5. The apparatus of claim 4, wherein the base of the first transistor is coupled to the collector of the second transistor.

6. The apparatus of claim 5 further comprising:

a diode coupled between the base of the second transistor and the collector of the second transistor.

7. The apparatus of claim 6 further comprising:

a first switch coupled to the first circuit such that when the first switch is in a first state the apparatus is enabled to reduce current overshoot and when the first switch is in a second state the apparatus is substantially disabled from reducing current overshoot.

8. The apparatus of claim 5, wherein the second transistor is a Schottky transistor.

9. The apparatus of claim 1 wherein the first circuit provides the first current to the first node when there is a transient decrease in the voltage at the first node.

10. The apparatus of claim 1 further comprising:

a second circuit coupled to a second node, wherein the second node is configured to couple to a second end of the load;

wherein the second circuit includes a second voltage controlled current source circuit which senses a voltage at the second end of the load and in response to a transient voltage at the second node provides a second current to be injected into the second node.

11. The apparatus of claim 10, wherein:

the first voltage controlled current source circuit comprises a first controllable current source responsively coupled with a first voltage controlled switch such that when the first voltage controlled switch is in a first state the first controllable current source is turned on and outputs the first current and when the first voltage controlled switch is in a second state the first controllable current source is turned substantially off; and the second voltage controlled current source circuit comprises a second controllable current source responsively coupled with a second voltage controlled switch such that when the second voltage controlled switch is in a first state the second controllable current source is turned on and outputs the second current and when the second voltage controlled switch is in a second state the second controllable current source is turned substantially off.

12. The apparatus of claim 11, wherein:

the first controllable current source includes a first transistor and the emitter of the first transistor is coupled to the first node; and the second controllable current source includes a second transistor and the emitter of the second transistor is coupled to the second node.

13. The apparatus of claim 12 further comprising:

a biasing signal source, which outputs a biasing signal, coupled to the base of the first transistor and the base of the second transistor wherein a first voltage at the base of the first transistor and a second voltage at the base of the second transistor varies in response to changes in the biasing signal, and wherein the first and second currents vary in relation to the changes in the biasing signal.

14. A method for reducing current overshoot through a load connected between a first node and a second node, comprising the steps of:

transmitting a first current through the load from the first node to the second node to compensate for a first current overshoot having a first polarity; and transmitting a second current through the load from the second node to the first node to compensate for a second current overshoot having a second polarity which is opposite to the first polarity.

15. The method of claim 14 further comprising the steps of:

sensing a first voltage at the first node;

sensing a second voltage at the second node;

transmitting the first current when the sensed first voltage has a negative polarity; and transmitting the second current when the sensed second voltage has a negative polarity.

16. The method of claim 15 further comprising the step of drawing a third current from the first node to compensate for current ringing.

17. The method of claim 16 further comprising the step of drawing a fourth current from the second node to compensate for current ringing.

* * * * *